(12) United States Patent
Kojo

(10) Patent No.: US 12,283,919 B2
(45) Date of Patent: Apr. 22, 2025

(54) OVEN-CONTROLLED CRYSTAL OSCILLATOR

(71) Applicant: DAISHINKU CORPORATION, Kakogawa (JP)

(72) Inventor: Takuya Kojo, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 0 days.

(21) Appl. No.: 18/278,424

(22) PCT Filed: Feb. 28, 2022

(86) PCT No.: PCT/JP2022/008247
§ 371 (c)(1),
(2) Date: Aug. 23, 2023

(87) PCT Pub. No.: WO2022/186124
PCT Pub. Date: Sep. 9, 2022

(65) Prior Publication Data
US 2024/0136976 A1 Apr. 25, 2024
US 2024/0235478 A9 Jul. 11, 2024

(30) Foreign Application Priority Data
Mar. 1, 2021 (JP) .................. 2021-031583

(51) Int. Cl.
*H03B 5/36* (2006.01)
*H03B 5/04* (2006.01)
(52) U.S. Cl.
CPC .............. *H03B 5/36* (2013.01); *H03B 5/04* (2013.01)

(58) Field of Classification Search
CPC .... H03B 5/36; H03B 5/04; H03B 5/32; H01L 23/02; H01L 23/12; H01L 23/14
USPC .......................................... 331/70
See application file for complete search history.

(56) References Cited

U.S. PATENT DOCUMENTS

| 10,812,017 | B1* | 10/2020 | Tseng ............... H01L 23/145 |
| 2017/0063379 | A1 | 3/2017 | Terasawa |
| 2018/0009195 | A1 | 1/2018 | Takeuchi et al. |
| 2018/0013386 | A1 | 1/2018 | Arai |
| 2018/0337634 | A1 | 11/2018 | Kondo |

FOREIGN PATENT DOCUMENTS

| CN | 106487331 A | 3/2017 |
| JP | 2005-039435 A | 2/2005 |
| JP | 2012-205093 A | 10/2012 |
| JP | 2017-046272 A | 3/2017 |
| JP | 2018-014705 A | 1/2018 |
| JP | 2018-196105 A | 12/2018 |
| JP | 2020-120195 A | 8/2020 |

* cited by examiner

*Primary Examiner* — Richard Tan
(74) *Attorney, Agent, or Firm* — METROLEX IP LAW GROUP, PLLC; Robert L. Scott, Esq.

(57) ABSTRACT

One or more embodiments of the disclosure may be an oven-controlled crystal oscillator that may include a core section hermetically encapsulated inside a thermal insulation package. The core section includes at least: an oscillation IC; a crystal resonator; and a heater IC. The core section is mounted on a core substrate that is mechanically connected to the package by a non-conductive adhesive. The core section and the package are electrically connected to each other by wire bonding. A space is provided between the core substrate and a bottom surface of the package.

8 Claims, 11 Drawing Sheets

OVEN-CONTROLLED CRYSTAL OSCILLATOR

TECHNICAL FIELD

The present invention relates to oven-controlled crystal oscillators.

BACKGROUND ART

In a piezoelectric resonator such as a crystal resonator, the vibration frequency changes depending on the temperature according to its frequency temperature characteristics. In order to keep the temperature around the piezoelectric resonator constant, an oven-controlled crystal (Xtal) oscillator (hereinafter also referred to as an "OCXO") is known. It has a configuration in which a piezoelectric resonator is encapsulated in a thermostatic oven (for example, see Patent Documents 1 and 2).

PRIOR ART DOCUMENTS

Patent Documents

[Patent Document 1] JP 2012-205093 A
[Patent Document 2] JP 2018-014705 A

SUMMARY OF THE INVENTION

Problem to be Solved by the Invention

The Applicant of the present application has already filed an application of an invention on an oven-controlled crystal oscillator in which a core section made by laminating an oscillation IC, a piezoelectric resonator and a heater IC is supported inside a heat insulating package via a core substrate (JP 2020-130421, not yet published at the time of filing of the present application). In such an oven-controlled crystal oscillator, mechanical connection performance between the core substrate and the package as well as electrical connection performance between the core section and the package influence the reliability of the device. Also, it is required to enhance thermal insulation of the core section.

The present invention was made in consideration of the above circumstances, an object of which is to provide an oven-controlled crystal oscillator capable of: obtaining high reliability in both of the mechanical connection of the core substrate to the package and the electrical connection between the core section and the package; and improving thermal insulation of the core section.

Means for Solving the Problem

In order to solve the above problem, an oven-controlled crystal oscillator of the present invention includes: a core section; and a thermal insulation package in which the core section is hermetically encapsulated. The core section includes at least: an oscillation IC; a piezoelectric resonator; and a heater IC. The core section is mounted on a flexible substrate that is mechanically connected to the package by a bonding material. The core section and the package are electrically connected to each other by wire bonding. A space is provided between the flexible substrate and a bottom surface of the package.

With the above-described configuration, the mechanical connection of the flexible substrate to the package by the bonding material is separated from the electrical connection between the core section and the package by wire bonding. Thus, it is possible to obtain high reliability in both of the mechanical connection and the electrical connection. For example, as the bonding material to connect the flexible substrate to the package, it is possible to use a flexible bonding material whose mechanical connection strength is not likely to decrease even when it is affected by external stress. As to the wire bonding between the core section and the package, the common impedance noise is not likely to be generated by using the metal wires having a low electrical resistance, which leads to improvement of carrier noise (CN) characteristics of the oven-controlled crystal oscillator. In addition, since the core section is connected to the package via the flexible substrate so that a space is formed under the flexible substrate, it is possible to improve thermal insulation of the core section.

In the above-described configuration, it is preferable that a bonding region of the flexible substrate to bond the flexible substrate to the package is not superimposed, in plan view, on a mounting region of the flexible substrate to mount the core section thereon. In this case, it is also preferable that a spacer member is provided such that the spacer member is closer to the core section than the bonding region is, and also preferable that the spacer member is interposed between the flexible substrate and the bottom surface of the package. In this way, the thickness of the bonding material applied onto the bonding region is defined by the spacer member, which also results in easy definition of the width of the space between the flexible substrate and the bottom surface of the package. Also, when the bonding material applied onto the bonding region shrinks, it is possible, due to the spacer member, to bend the flexible substrate in the direction where the width of the space between the flexible substrate and the bottom surface of the package increases. Thus, it is possible to improve thermal insulation of the core section.

In the above-described configuration, it is preferable that the flexible substrate is made of a resin material having heat resistance. Examples of the resin material include polyimide. Also in the above-described configuration, it is preferable that the core section is vacuum-sealed in the package.

In the above-described configuration, it is preferable that the flexible substrate includes a slit that is formed between: a mounting region thereof, on a front surface of which the core section is mounted; and a bonding region thereof, which is to be bonded to the package. It is also preferable that an opening is provided in the flexible substrate, in a region directly under the core section. Furthermore, it is preferable that the piezoelectric resonator is not directly connected to the package by wire, and only the oscillation IC is directly connected to the piezoelectric resonator by wire.

Effects of the Invention

In the oven-controlled crystal oscillator of the present invention, the mechanical connection of the flexible substrate to the package by the bonding material is separated from the electrical connection between the core section and the package by wire bonding. Thus, it is possible to obtain high reliability in both of the mechanical connection and the electrical connection. For example, as the bonding material to connect the flexible substrate to the package, it is possible to use a flexible bonding material whose mechanical connection strength is not likely to decrease even when it is affected by external stress. As to the wire bonding between the core section and the package, the common impedance noise is not likely to be generated by using the metal wires having a low electrical resistance, which leads to improvement of carrier noise (CN) characteristics of the oven-controlled crystal oscillator. In addition, since the core section is connected to the package via the flexible substrate so that a space is formed under the flexible substrate, it is possible to improve thermal insulation of the core section.

MODE FOR CARRYING OUT THE INVENTION

Embodiment 1

Hereinafter, an embodiment of the present invention will be described in detail with reference to the drawings.

Figure 1:
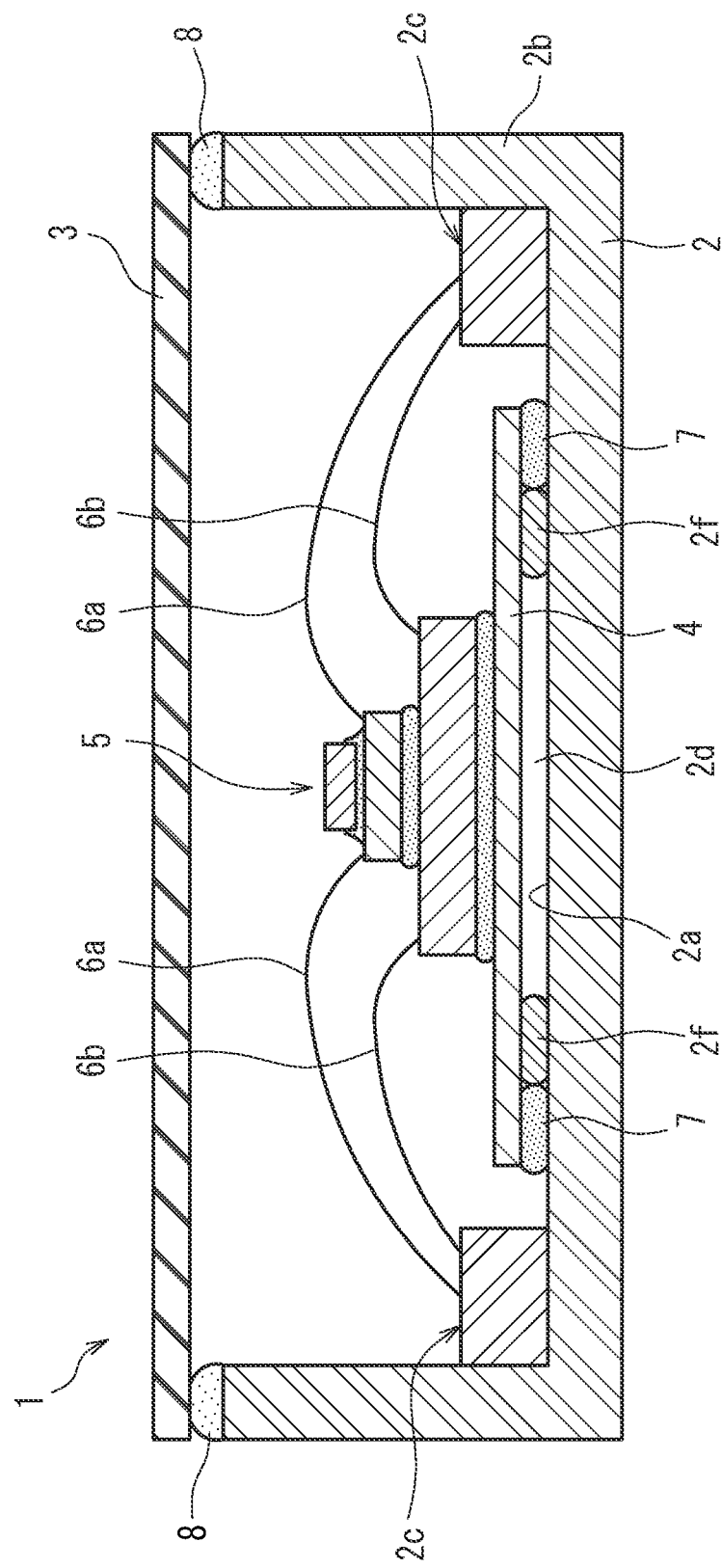
FIG. 1 is a cross-sectional view illustrating a schematic configuration of an OCXO according to an embodiment of the present invention.
Figure 2:
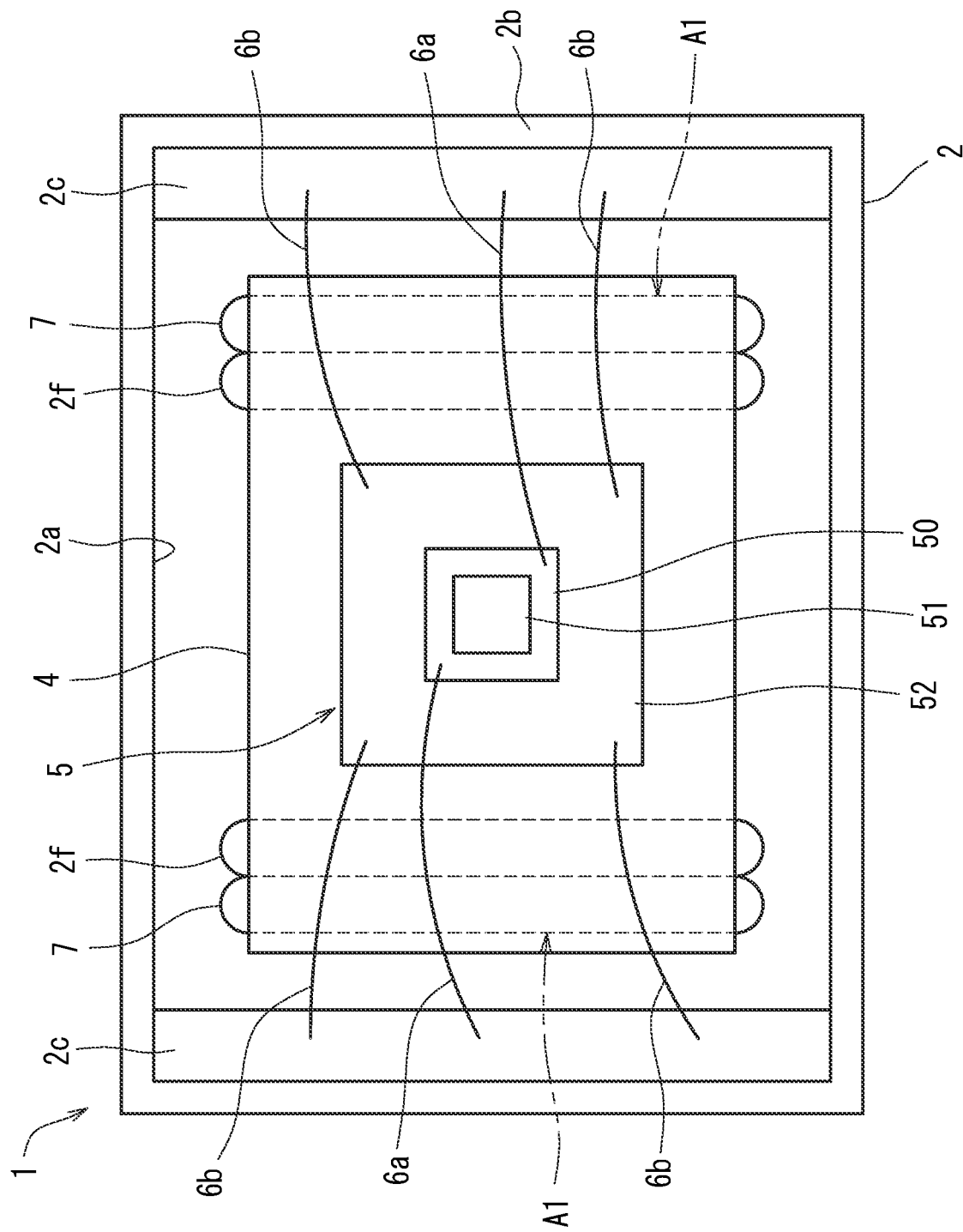
FIG. 2 is a plan view of the OCXO of FIG. 1.

As shown in FIGS. 1 and 2, an OCXO 1 according to this embodiment has a configuration in which a core section 5 is disposed in a package (case) 2 made of ceramic or the like and having a substantially rectangular parallelepiped shape such that the core section 5 is hermetically sealed by a lid 3. The package 2 includes a recess part 2a whose upper part is opened, and the core section 5 is hermetically encapsulated in the recess part 2a. To an upper surface of a peripheral wall part 2b that surrounds the recess part 2a, the lid 3 is fixed by seam welding via a sealant 8. Thus, the inside of the package 2 is hermetically sealed (in an airtight state). As the sealant 8, a metal sealant such as Au-Su alloy and solder is suitably used, however, other sealants including low melting point glass may also be used. Alternatively, the sealing may be performed by seam welding with metal rings, direct seam welding without metal rings, or by beam welding. (However, note that the seam welding is preferred from the viewpoint of prevention of loss of vacuum). The space inside the package 2 is preferably in a vacuum state (for example, with the degree of vacuum not more than 10 Pa) or an atmosphere with low thermal conductivity with low pressure nitrogen or low pressure argon. FIG. 2 shows the OCXO 1 in the state in which the lid 3 is removed in order to indicate the internal configuration of the OCXO 1.

Step parts 2c are formed on the inner wall surface of the peripheral wall part 2b of the package 2 so as to be along the arrangement of connection terminals (not shown). The core section 5 is disposed on the bottom surface of the recess part 2a between the facing pair of step parts 2c and 2c, via a core substrate (flexible substrate) 4 made of a flexible material having a plate shape. Alternatively, the step parts 2c may be formed to surround the four sides of the bottom surface of the recess part 2a. The core substrate 4 is bonded to the bottom surface of the recess part 2a by a non-conductive adhesive (bonding material) 7. A space (gap) 2d is formed under the core substrate 4. Also, external terminals (not shown) formed on the respective components of the core section 5 are connected to the connection terminals formed on the step surfaces of the step parts 2c by wire bonding via wires 6a and 6b. On the respective inner sides of the non-conductive adhesives 7 and 7, spacer members 2f and 2f are provided.

The non-conductive adhesives 7 and 7 are disposed on both end parts of the core substrate 4 in the long-side direction so as to be straight lines extending in the short-side direction of the core substrate 4 (i.e. in the direction orthogonally intersecting the direction of the sheet on which FIG. 1 is illustrated). Each spacer member 2f is located side by side with the corresponding non-conductive adhesive 7 so as to be a straight line extending in the short-side direction of the core substrate 4. Thus, the respective spacer members 2f and 2f are interposed, each inside the corresponding non-conductive adhesive 7, between the core substrate 4 and the bottom surface of the package 2. Both end parts of the core substrate 4 in the long-side direction are supported by the respective spacer members 2f and 2f.

The core substrate 4 is made of a resin material having heat resistance and flexibility such as polyimide. The spacer member 2f is made of a paste material such as molybdenum and tungsten. The core substrate 4 is disposed so as not to come in contact with the bottom surface of the package 2. The thickness of the core substrate 4 is preferably 5 to 100 μm. The width (distance) of the space 2d between the core substrate 4 and the bottom surface of the package 2 is preferably 5 to 50 μm.

A bonding region A1 for bonding the core substrate 4 to the package 2 (i.e. a region A1 onto which the non-conductive adhesive 7 is applied) is not superimposed, in plan view, on a region on the front surface of the core substrate 4, on which the core section 5 is located. As shown in FIG. 2, the core section 5 is disposed inside the respective pair of spacer members 2f and 2f in plan view, and the respective bonding regions A1 and A1 are disposed each outside the corresponding one of the pair of spacer members 2f and 2f. The distance from a heater IC 52 on the core substrate 4 to the bonding regions A1 is preferably 250 to 1000 μm.

Figure 3:
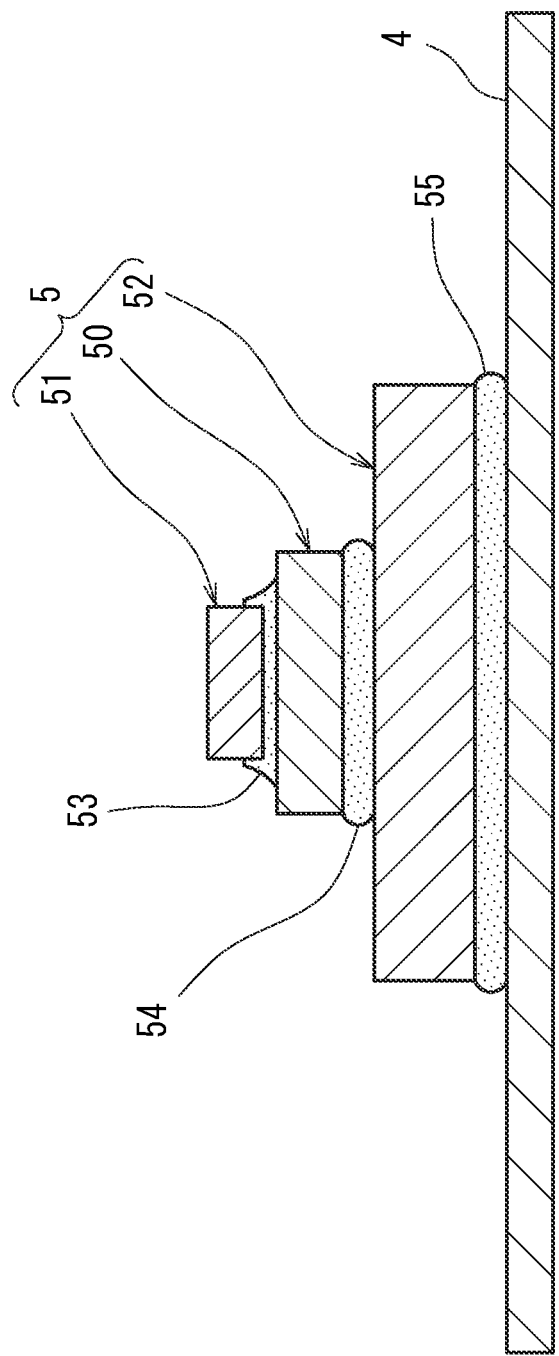
FIG. 3 is a cross-sectional view illustrating a schematic configuration of a core section and a core substrate of the OCXO of FIG. 1.

Here, the core section 5 is described referring to FIG. 3. FIG. 3 shows the core section 5 mounted on the core substrate 4. The core section 5 packages various electronic components used for the OCXO 1, and has a three-layer structure (layered structure) in which an oscillation IC 51, a crystal resonator (piezoelectric resonator) 50 and the heater IC 52 are laminated in this order from the uppermost layer side. Respective areas in plan view of the oscillation IC 51, the crystal resonator 50 and the heater IC 52 become gradually smaller from the downside to the upside. The core section 5 stabilizes oscillation frequency of the OCXO 1 by especially adjusting the temperatures of the crystal resonator 50, the oscillation IC 51 and the heater IC 52, whose temperature characteristics are large. The electronic components of the core section 5 are not sealed by a sealing resin, however, depending on the sealing atmosphere, the electronic components may be sealed by the sealing resin.

A crystal oscillator 100 is constituted of the crystal resonator 50 and the oscillation IC 51. The oscillation IC 51 is mounted on the crystal resonator 50 via a plurality of metal bumps. The oscillation frequency of the OCXO 1 is controlled by controlling the piezoelectric vibration of the crystal resonator 50 by the oscillation IC 51. The crystal oscillator 100 will be described later in detail.

Between the respective facing surfaces of the crystal resonator 50 and the oscillation IC 51, a non-conductive adhesive 53 is interposed, which fixes the respective facing surfaces of the crystal resonator 50 and the oscillation IC 51 to each other. In this case, the front surface of the crystal resonator 50 (i.e. a first main surface 201 of a first sealing member 20) is bonded to the rear surface of the oscillation IC 51 via the non-conductive adhesive 53.

The oscillation IC 51 has the area smaller than the area of the crystal resonator 50 in plan view. Thus, the whole oscillation IC 51 is disposed within the area of the crystal resonator 50 in plan view. Also, the whole rear surface of the oscillation IC 51 is bonded to the front surface of the crystal resonator 50 (i.e. the first main surface 201 of the first sealing member 20).

The heater IC 52 has a configuration in which a heating element (a heat source), a control circuit for controlling the temperature of the heating element (a current control circuit) and a temperature sensor for detecting the temperature of the heating element are integrally formed. By controlling the temperature of the core section 5 by the heater IC 52, it is possible to keep the temperature of the core section 5 substantially constant, which contributes to stabilization of the oscillation frequency of the OCXO 1.

Between the respective facing surfaces of the crystal resonator 50 and the heater IC 52, a non-conductive adhesive 54 is interposed, which fixes the respective facing surfaces of the crystal resonator 50 and the heater IC 52 to each other. In this case, the rear surface of the crystal resonator 50 (i.e. a second main surface of a second sealing member 30) is bonded to the front surface of the heater IC 52 via the non-conductive adhesive 54.

The crystal resonator 50 has the area smaller than the area of the heater IC 52 in plan view. Thus, the whole crystal resonator 50 is disposed within the area of the heater IC 52 in plan view. Also, the whole rear surface of the crystal resonator 50 (i.e. the second main surface of the second sealing member) is bonded to the front surface of the heater IC 52.

Between the respective facing surfaces of the heater IC 52 and the core substrate 4, a non-conductive adhesive 55 is interposed, which fixes the respective facing surfaces of the heater IC 52 and the core substrate 4 to each other. As the non-conductive adhesives 53, 54 and 55, a polyimide adhesive or an epoxy adhesive is, for example, used.

In the core section 5 shown in FIG. 3, the external terminals for wire bonding are formed on the front surfaces of the crystal resonator 50 and the heater IC 52. The wire bonding of the crystal resonator 50 as well as the wire bonding of the heater IC 52 are not performed before mounting the core section 5 on the package 2, but are performed after mounting the core section 5 on the package 2. That is, as shown in FIG. 1, after the core section 5 is mounted on the package 2, the external terminals formed on the front surface of the crystal resonator 50 are connected to the connection terminals formed on the step surfaces of the step parts 2c via the wires 6a. Also, the external terminals formed on the front surface of the heater IC 52 are connected to the connection terminals formed on the step surfaces of the step parts 2c via the wires 6b. In this way, it is possible to perform wire bonding efficiently by performing it after mounting the core section 5 on the package 2, which contributes to excellent productivity of the OCXO 1.

Although the kind of the crystal resonator 50 used for the core section 5 is not particularly limited, a device having a sandwich structure is suitably used, which serves to make the device thinner. The device having the sandwich structure is constituted of: the first sealing member and the second sealing member both made of glass or crystal; and a piezoelectric resonator plate made of, for example, crystal. The piezoelectric resonator plate includes a vibrating part, on respective main surfaces of which excitation electrodes are formed. The first sealing member and the second sealing member are laminated and bonded via the piezoelectric resonator plate. Thus, the vibrating part of the piezoelectric resonator plate is hermetically sealed in an internal space of this three-layer structured device.

Figure 4:
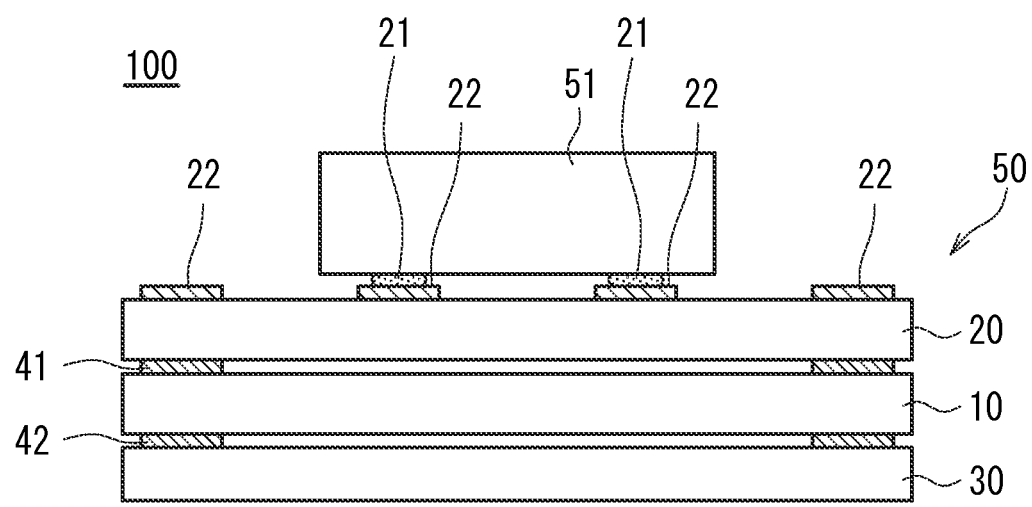
FIG. 4 is a schematic configuration diagram schematically illustrating a configuration of a crystal oscillator (a crystal resonator and an oscillation IC) of the core section of FIG. 3.
Figure 5:
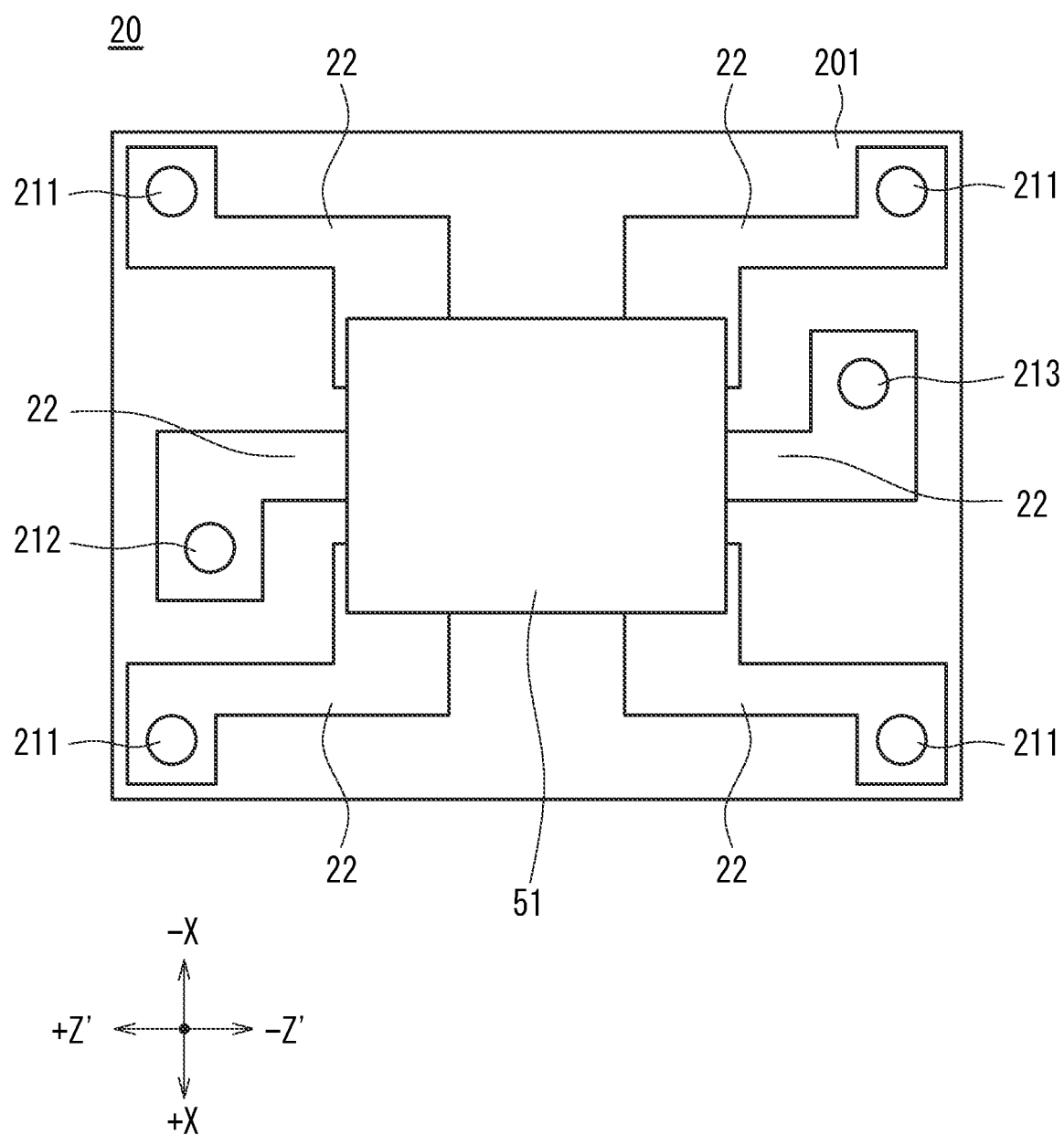
FIG. 5 is a schematic plan view illustrating a first main surface of a first sealing member of the crystal oscillator of FIG. 4.

The crystal oscillator 100 integrally formed by the sandwich-structured crystal resonator 50 and the oscillation IC 51 is exemplarily described referring to FIGS. 4 and 5. Since the sandwich-structured crystal resonator is publicly known, the detail description of the inner structure of the crystal resonator 50 is omitted here.

As shown in FIG. 4, the crystal oscillator 100 includes: a crystal resonator plate (piezoelectric resonator plate) 10; the first sealing member 20; the second sealing member 30; and the oscillation IC 51. In this crystal oscillator 100, the crystal resonator plate 10 is bonded to the first sealing member 20 by an annular-shaped seal bonding part 41, and also the crystal resonator plate 10 is bonded to the second sealing member 30 by an annular-shaped seal bonding part 42. Thus, the package having a sandwich structure is formed so as to have a substantially rectangular parallelepiped shape. The seal bonding parts 41 and 42 are respectively formed, for example, by the following procedures: forming respectively bonding patterns having a surface of an Au layer (for example, a bonding pattern formed by a Ti layer and an Au layer in this order from the lowermost layer side) on respective bonding surfaces of the crystal resonator plate 10, the first sealing member 20 and the second sealing member 30; and performing Au—Au diffusion bonding by bonding the respective bonding surfaces. With this configuration, the gap size between the crystal resonator plate 10 and the respective sealing members 20 and 30 can be minimized to approximately 0.15 to 1 μm, which is beneficial to make the core section 5 thin and also to reduce the heat capacity of the core section 5.

Like this, in the crystal oscillator 100, an internal space (cavity) inside the package is formed by bonding the first sealing member 20 and the second sealing member 30 respectively to the main surfaces of the crystal resonator plate 10, where the vibrating part is formed. Thus, the vibrating part of the crystal resonator plate 10 is hermetically sealed in the internal space. The oscillation IC 51 mounted on the first sealing member 20 is a one-chip integrated circuit element constituting, with the crystal resonator plate 10, an oscillation circuit.

Figure 6:
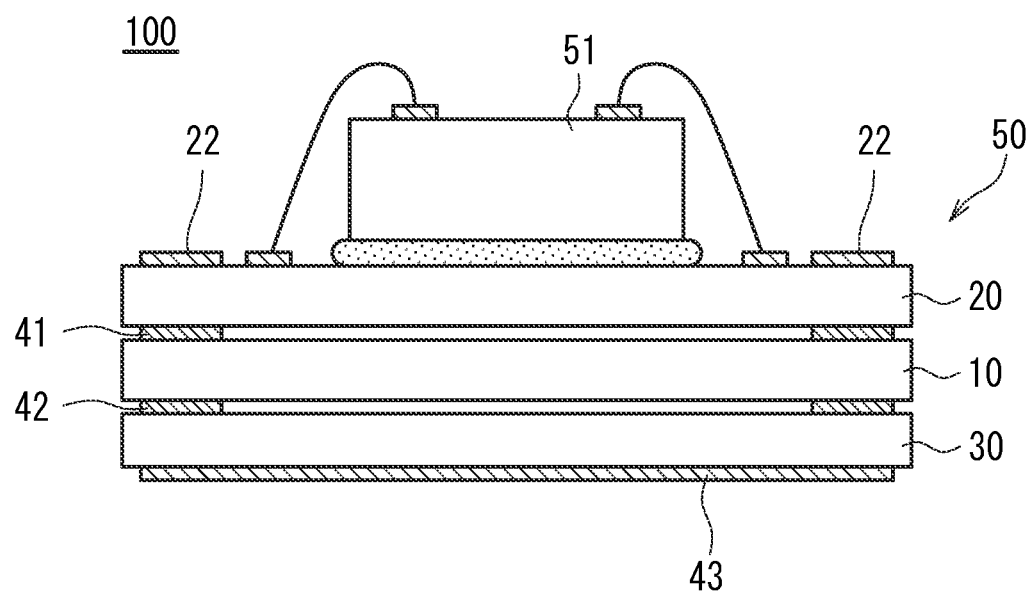
FIG. 6 is a schematic configuration diagram illustrating a variation of the crystal oscillator included in the core section of FIG. 2.

In the core section 5 shown in FIG. 4, the oscillation IC 51 is mounted on the crystal resonator 50 via a plurality of metal bumps 21 (i.e. by flip chip bonding). However, the present invention is not limited thereto. As shown in FIG. 6, the oscillation IC 51 may be mounted on the crystal resonator 50 by die bonding, and may be electrically connected to the crystal resonator 50 by wire bonding. Also, on the rear surface (i.e. the surface to be bonded to the heater IC 52) of the crystal resonator 50, a solid electrode 43 may be formed, to which GND potential is applied when the OCXO 1 operates.

In the configuration in which the oscillation IC 51 is mounted on the crystal resonator 50 by die bonding, the contact area between the oscillation IC 51 and the crystal resonator 50 is large compared to the configuration using the flip chip bonding, which leads to easy transfer of effect of heat generated in the oscillation IC 51 to the heater IC 52 that controls the temperature, via the crystal resonator 50. Therefore, the temperature of the core section 5 (i.e. the temperature of the oscillation IC 51, the crystal resonator 50 and the heater IC 52) can be efficiently transmitted to a temperature sensor that is provided in the heater IC 52, which results in accurate temperature control. Originally, it is preferable that the crystal resonator 50 is not affected by the oscillation IC 51 that is a heat source other than the heater. However, it is actually difficult to avoid the heat effect by the oscillation IC 51. In this case, it is possible to easily control the temperature by efficiently transmitting the temperature change of the crystal resonator 50 caused by the oscillation IC 51 to the temperature sensor of the heater IC 52.

Figure 7:
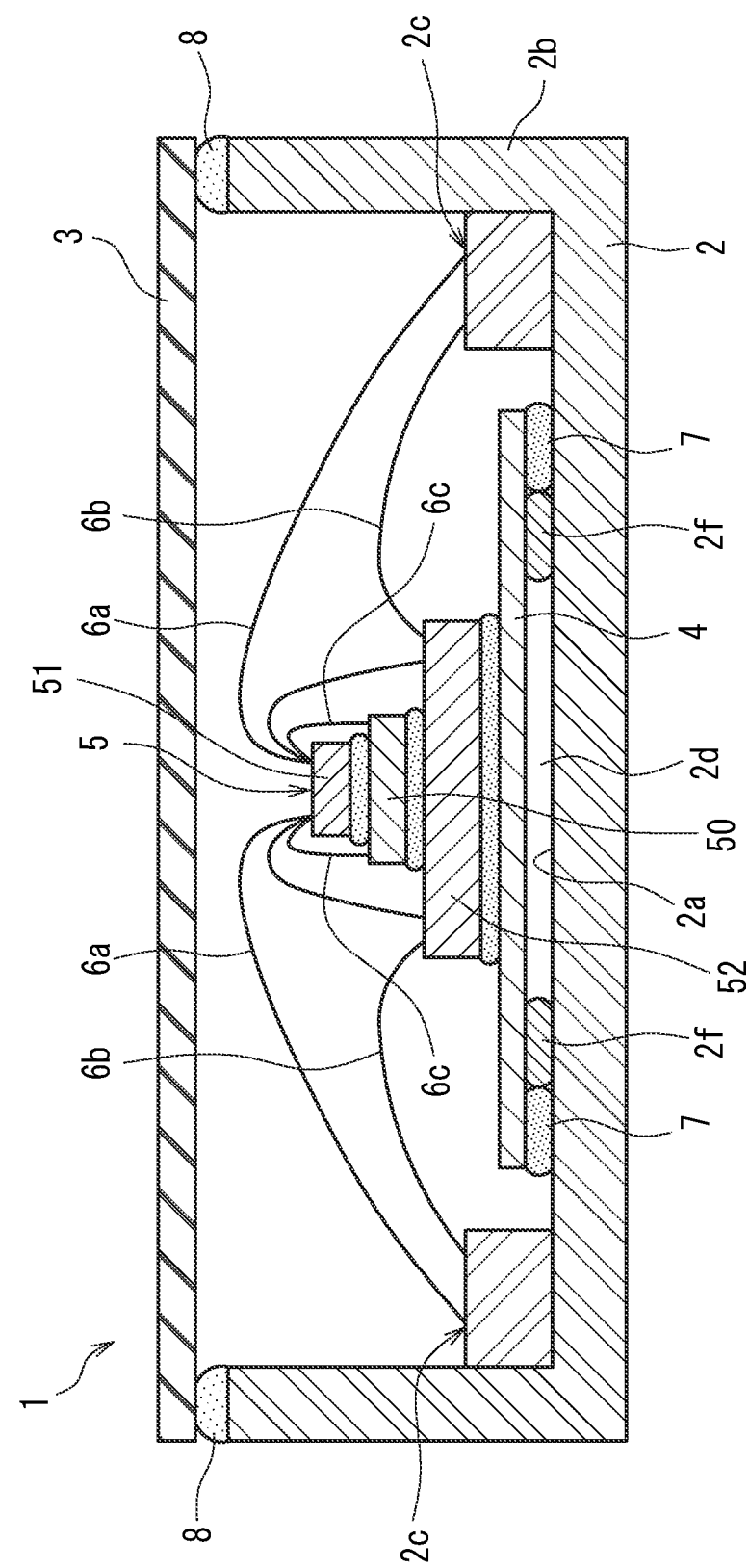
FIG. 7 is a cross-sectional view illustrating a schematic configuration of the OCXO according to a variation.

Also, when the oscillation IC 51 and the crystal resonator 50 are electrically connected to each other by wire bonding, it is preferable, in the wire bonding between the core section 5 and the package 2, that the crystal resonator 50 is not directly connected to the package 2 by wire and only the oscillation IC 51 is directly connected to the crystal resonator 50 by wire, as shown in FIG. 7. In FIG. 7, the crystal resonator 50 is connected, by wires 6c, to only the oscillation IC 51. With this configuration, it is possible to prevent the heat from escaping from the crystal resonator 50 to the package 2 via the wire. As a result, thermal insulation of the crystal resonator 50 increases, and thus temperature controllability of the crystal resonator 50 increases.

As shown in FIG. 5, external terminals 22 are formed on the front surface of the crystal resonator 50. One end (outer side peripheral end) of each of two of the external terminals 22 is electrically connected to the excitation electrode of the vibrating part (via wirings and through holes in the crystal resonator 50), and the other end (inner side peripheral end) of each of these two external terminals 22 is connected to the oscillation IC 51. Also, one end (outer side peripheral end) of each of the remaining four external terminals 22 (i.e. the external terminals 22 formed on the four corners) is used for wire bonding to the package 2, and the other end (inner side peripheral end) of these remaining external terminals 22 is connected to the oscillation IC 51. The oscillation IC 51 is connected to the external terminals 22 by the flip chip bonding (FCB) method using metal bumps.

In this embodiment of the OCXO 1 having the above-described configuration, the core section 5 is hermetically encapsulated inside the thermal insulation package 2. The core section 5 is mounted on the flexible core substrate 4. The core substrate 4 is mechanically connected to the package 2 by the non-conductive adhesive 7 while the core section 5 and package 2 are electrically connected to each other by wire bonding. The space 2d is provided between the core substrate and the bottom surface of the package 2.

In this embodiment, the mechanical connection of core substrate 4 to the package 2 by the non-conductive adhesive 7 is separated from the electrical connection between the core section 5 and the package 2 by wire bonding, in order to obtain high reliability in both kinds of connections. For example, it is possible to use, as the non-conductive adhesive 7 to connect the core substrate 4 to the package 2, a flexible adhesive whose mechanical connection strength is not likely to decrease even when it is affected by external stress. As to the wire bonding between the core section 5 and the package 2, the common impedance noise is not likely to be generated by using the metal wires having a low electrical resistance, which leads to improvement of the carrier noise (CN) characteristics of the OCXO 1.

Specifically, by using the core section 5 constituted of the oscillation IC 51, the crystal resonator 50 and the heater IC 52 that are layered on each other, the heat capacity of the core section 5 can be reduced. When the heat capacity of the core section 5 is reduced, it is possible to control the temperature with low electric power, and furthermore, it is possible to improve the stability of the OCXO 1 by improving the temperature followability of the core section 5. When the heat capacity of the OCXO 1 is reduced, the OCXO 1 is likely to be affected by changes in the outside temperature. However, by interposing the core substrate 4 between the core section and the package 2, it is possible to reduce stress as well as heat escape.

Here a case is supposed, in which the electrical connection of the core section 5 to the package 2 is mediated by the core substrate 4. In this case, the core section 5 is connected to the core substrate 4 on the front surface of the core substrate 4 while the core substrate 4 is connected to the package 2 on the rear surface of the core substrate 4. Also, when connecting the core substrate 4 to the package 2, it is necessary to connect the connection terminals on the rear surface of the core substrate 4 to the connection terminals on the front surface of the package 2 using a conductive adhesive. That is, it is required to simultaneously perform the electrical connection and the mechanical connection between the core substrate 4 and the package 2 using the conductive adhesive.

However, the conductive adhesive made from underfill in which a conductive filler is mixed is hard compared to the non-conductive adhesive in which no conductive filler is contained. Thus, the mechanical connection strength may decrease due to external stress. Regarding the electrical connection also, the conductive adhesive has the electrical resistance higher than that of metal wires, and thus the common impedance noise is likely to be generated. Therefore, the carrier noise (CN) characteristics of the OCXO 1 decreases.

In contrast to the above supposition, in the OCXO 1 according to this embodiment, the crystal resonator 50 and the heater IC 52 of the core section 5 are directly connected to the connection terminals formed in the package 2 via the wires 6a and 6b. Thus, the core substrate 4 is not required to mediate the electrical connection between the core section 5 and the package 2.

As a result, in the OCXO 1 according to this embodiment, since only the mechanical connection is sufficient as to the bonding of the core section 5 to the package 2, the non-conductive adhesive can be used. As the non-conductive adhesive, it is possible to use a flexible one compared to the conductive adhesive. Also, the non-conductive adhesive has a mechanical connection strength that is not likely to decrease even when it is affected by external stress. As to the electrical connection between the core section 5 and the package 2, the common impedance noise is not likely to be generated by using the metal wires having a low electrical resistance, which leads to improvement of the carrier noise (CN) characteristics of the OCXO 1.

Furthermore, the core substrate 4 is only required to support the core section 5 with respect to the package 2. Thus, the material options for the core substrate 4 increase.

As the core substrate 4, it is preferable to use a material having excellent thermal insulation and heat resistance. Also it is preferable to use a flexible substrate so as to reduce the influence of the external stress. Thus, in this embodiment, the flexible substrate made of a resin material such as polyimide is adopted as the core substrate 4.

In addition to the above, in this embodiment, it is possible to increase the thermal insulation of the core section 5 by connecting the core section 5 to the package 2 via the core substrate 4 and furthermore forming the space 2d under the core substrate 4. Also, by forming the pair of step parts 2c and 2c in the package 2 so as to form the connection terminals on the step parts 2c, the connection terminals get close to an opening part of the package 2, which contributes to easy wire bonding of the core section 5 to the package 2.

In this embodiment, the spacer members 2f are interposed between the core substrate 4 and the bottom surface of the package 2, at both end parts of the core substrate 4 in the long-side direction. The spacer members 2f are disposed respectively inside the bonding regions A1 for bonding the core substrate 4 to the package 2. That is, the positions of the spacer members 2f are closer to the region on which the core section 5 is mounted than the positions of the bonding regions A1 are. The thickness of the non-conductive adhesive 7 applied onto the bonding regions A1 is defined by the spacer members 2f, which results in easy definition of the width of the space 2d between the core substrate 4 and the bottom surface of the package 2. The thickness of the spacer members 2f is preferably 5 to 50 μm.

Here, if no spacer member 2f is provided, the thickness of the non-conductive adhesive 7 varies depending on the applied amount of the non-conductive adhesive 7 onto the bonding region A1, which causes variations in the width of the space 2d between the core substrate 4 and the package 2. Variations also occur in the distance from the heater IC 52 on the core substrate 4 to the non-conductive adhesive 7 applied onto the bonding region A1. As a result, it will be difficult to stably perform the wire bonding of the crystal resonator 50 and the wire bonding of the heater IC 52.

However, in this embodiment, the thickness of the non-conductive adhesive 7 applied onto the bonding region A1 is defined by the spacer member 2f. Thus, it is possible to reduce the variation in the width of the space 2d between the core substrate 4 and the bottom surface of the package 2. Also, it is possible to reduce the variation in the distance from the heater IC 52 on the core substrate 4 to the non-conductive adhesive 7 applied onto the bonding region A1. Thus, it is possible to stably perform the wire bonding of the crystal resonator 50 and the wire bonding of the heater IC 52 by forming the core substrate 4 by a specific material, setting the width of the space 2d between the core substrate 4 and the bottom surface of the package 2 within a predetermined range, and furthermore setting the distance from the heater IC 52 on the core substrate 4 to the non-conductive adhesive 7 applied onto the bonding region A1 within a predetermined range. That is, it is possible to reliably perform ultrasonic application by wire bonding by bending the core substrate 4 at the time of the wire bonding so that the core substrate 4 comes into contact with the bottom surface of the recces part 2a of the package 2 and that there is no gap between the core substrate 4 and the bottom surface of the package 2, which results in stable wire bonding of the crystal resonator 50 and the wire bonding of the heater IC 52. Specifically, the core substrate 4 is made of polyimide. The thickness of the core substrate 4 is set to 5 to 100 μm. The width of the space 2d between the core substrate 4 and the bottom surface of the package 2 is set to 5 to 50 μm. The distance from the heater IC 52 on the core substrate 4 to the non-conductive adhesive 7 applied onto the bonding region A1 is set to 250 to 1000 μm.

In the case where the width of the space 2d between the core substrate 4 and the bottom surface of the package 2 is larger than 50 μm, or in the case where the distance from the heater IC 52 on the core substrate 4 to the non-conductive adhesive 7 applied onto the bonding region A1 is larger than 1000 μm, the core substrate 4 bends too much at the time of the wire bonding, which causes difficulty in stable wire bonding.

Also in this embodiment, when the non-conductive adhesives 7 and 7 applied onto the respective bonding regions A1 shrink, it is possible to bend the core substrate 4 in the direction where the width of the space 2d between the core substrate 4 and the bottom surface of the package 2 increases, due to the spacer members 2f and 2f. Thus, it is possible to improve thermal insulation of the core section 5.

The present invention may be embodied in other forms without departing from the gist or essential characteristics thereof. The foregoing embodiment is therefore to be considered in all respects as illustrative and not limiting. The scope of the invention is indicated by the appended claims rather than by the foregoing description, and all modifications and changes that come within the meaning and range of equivalency of the claims are intended to be embraced therein.

For example, in the above embodiments, the crystal oscillator 100 including the sandwich-structured crystal resonator 50 is used. However, the present invention is not limited thereto. An oscillator having a structure other than the sandwich structure (for example, a surface mount device (SMD) oscillator) may be used.

Also, the number of the heaters included in the OCXO 1 is not particularly limited. The OCXO 1 may have a heater other than the heater included in the heater IC 52. Examples of this configuration include: a configuration in which a heater is further added onto the core section 5; a configuration in which a heater is added to a mounting region for a circuit component, the region provided in the package 2 on a place other than the region for the core section 5; and a configuration in which a film-shaped heater is embedded in a main body of the package 2.

Embodiment 2

In order to improve the temperature controllability in the OCXO 1, it is important to reduce heat dissipation from the core section 5 to the package 2. Here, the heat dissipation from the core section 5 to the package 2 is generated mainly by heat transfer via the core substrate 4. Thus, it is possible to improve the temperature controllability in the OCXO 1 by reducing the heat transfer amount by the core substrate 4. In embodiment 2, a configuration of the core substrate 4 will be exemplarily described, in which the heat transfer amount from the core section 5 to the package 2 can be decreased.

Figure 8:
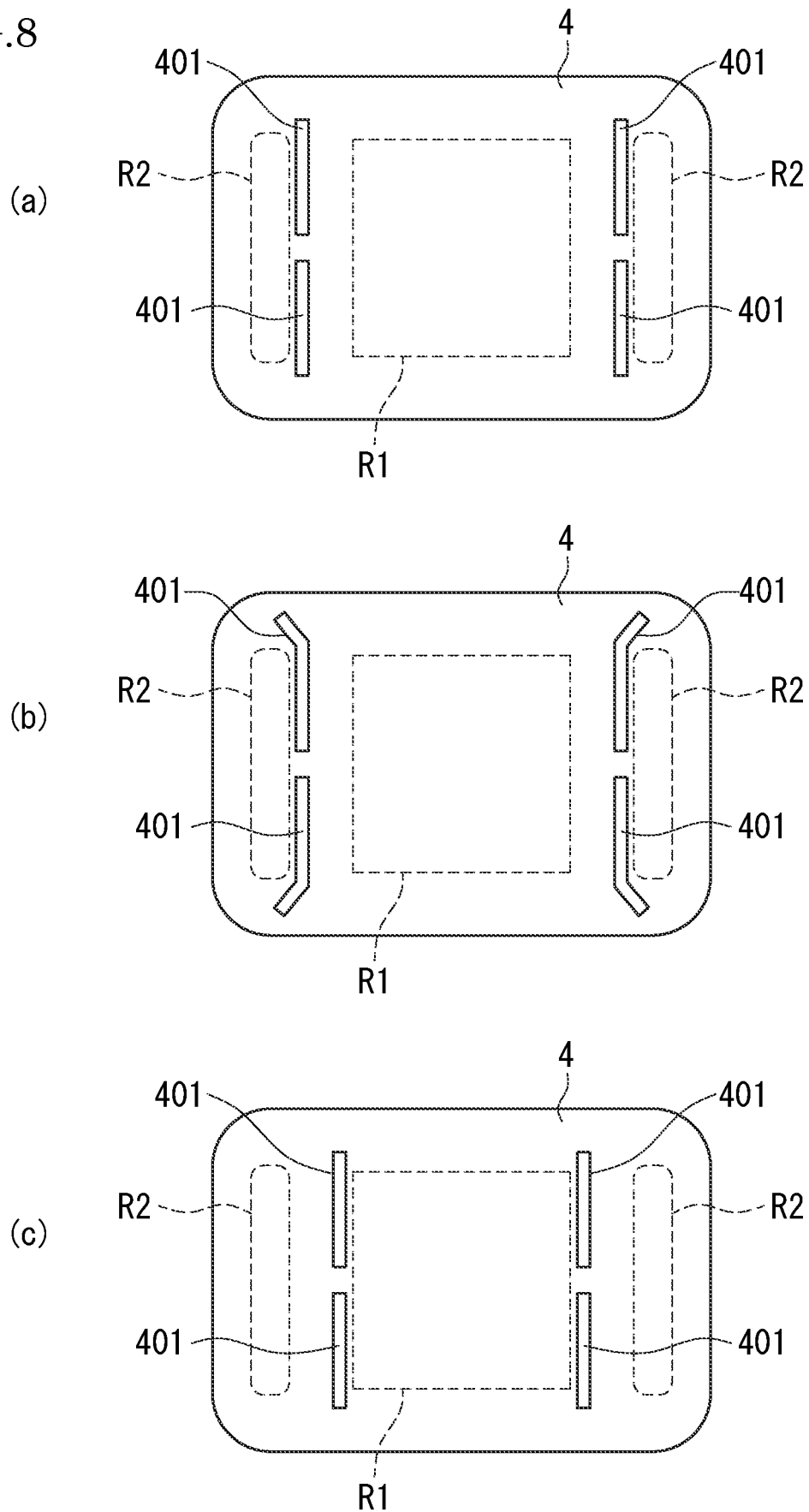
FIGS. 8(a) to 8(c) are plan views each illustrating an example of the core substrate.

FIG. 8 are plan views each illustrating an example of the core substrate 4 according to embodiment 2. In FIGS. 8, a region R1 for mounting the heater IC 52 as a part of the core section 5 thereon is located on the front surface of the core substrate 4. A region R2 to be bonded to the package 2 (i.e. the region onto which the adhesive is applied) is located on the rear surface of the core substrate 4.

In the core substrate 4 according to embodiment 2, slits 401 are disposed between the region R1 and the region R2. A heat transfer path between the region R1 and the region R2 becomes narrower due to the slits 401. Thus, it is possible to reduce the heat dissipation from the core section 5 to the package 2 caused by the heat transfer via the core substrate 4.

In order to appropriately obtain a heat transfer reduction effect (thermal insulation) by the slits 401, it is preferable that the slits 401 are arranged along its longitudinal direction (up-down direction in FIG. 8) that orthogonally intersects the arrangement direction (left-right direction in FIG. 8) of the regions R2 arranged on both sides of the core substrate 4. Thus, the slits 401 can prevent the heat from being transferred from the region R1 to the regions R2 over a wide range, which leads to improvement of thermal insulation by the slits 401.

Since the size of the slit 401 in its lateral direction (left-right direction in FIG. 8) does not particularly affect the thermal insulation of the slit 401, it is preferably made as small as possible from the viewpoint of avoiding decrease in strength of the core substrate 4. When the strength of the core substrate 4 decreases, ultrasound does not efficiently contribute to wire bonding of the core section 5 to the package 2, which prevents good wire bonding.

As to the slit 401 disposed between the region R1 and one region R2, it is more preferable to make a plurality of slits divided in the longitudinal direction than to make one long slit (see FIG. 8(a)). A plurality of divided slits 401 can avoid decrease in strength of the core substrate 4 compared to the case in which one long slit is made.

The shape of the slit 401 is not limited to a straight line shape. For example, the slit 401 may be bent along the circumference of the region R2 (see FIG. 8(b)). Like this, by bending the slit 401 along the surrounding shape of the region R2, it is possible to effectively block the heat transfer to the region R2. Thus, effective thermal insulation can be obtained by the slit 401.

Also, the slit 401 is not limited to be located adjacent to the region R2 between the region R1 and the region R2. The slit 401 may be disposed adjacent to the region R1 (see FIG. 8(c)). Like this, by disposing the slit 401 adjacent to the region R1, it is possible to efficiently block the heat transfer from the region R1 (i.e. heat transfer from the heater IC 52 as the heat source), that is, it is possible to efficiently block the heat transfer in the vicinity of the heat source of the heat to be radiantly transferred via the region R1. Thus, effective thermal insulation can be obtained by the slit 401.

Embodiment 3

Figure 9:
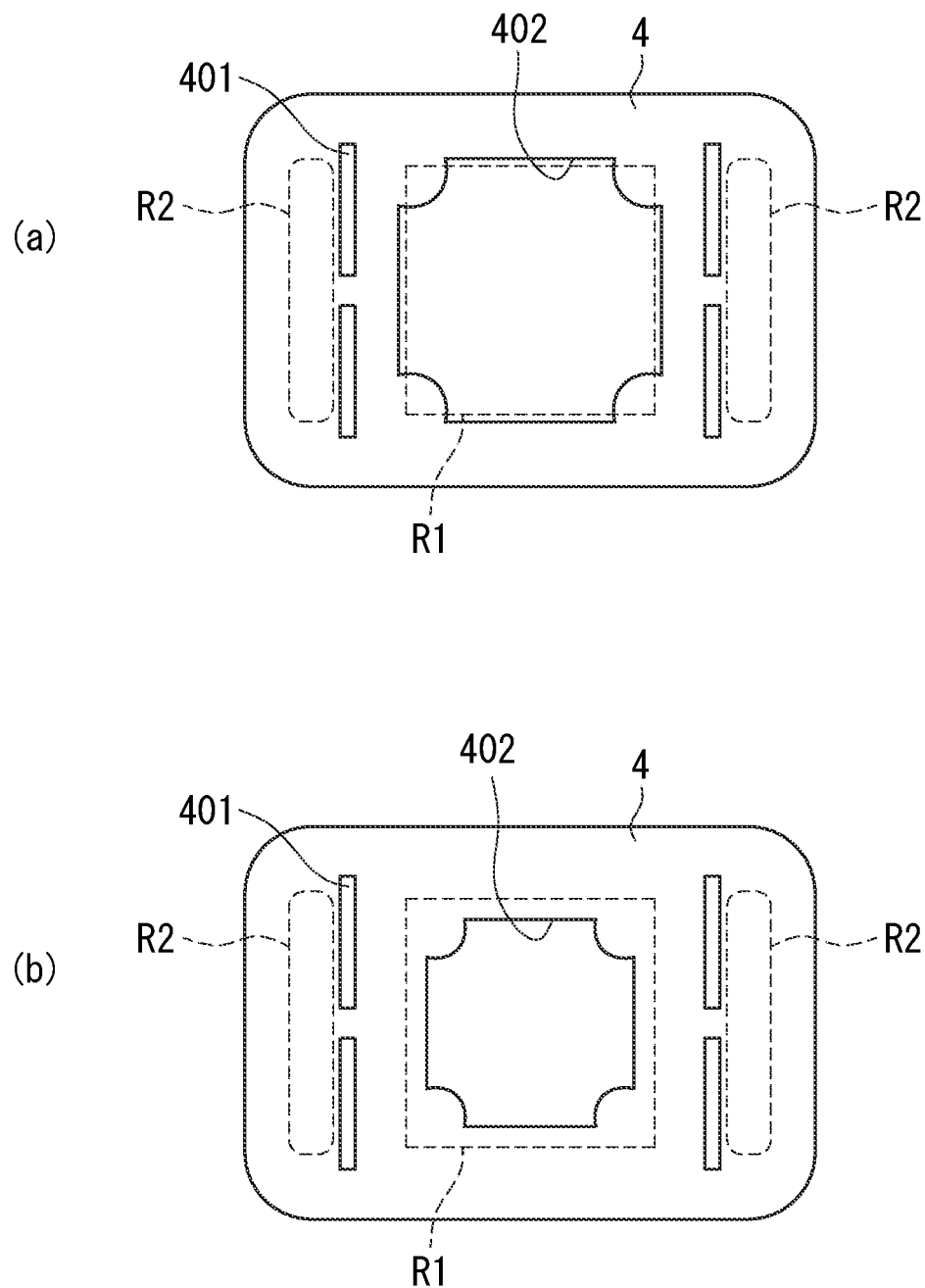
FIGS. 9(a) and 9(b) are plan views each illustrating a variation of the core substrate.

In embodiment 3, another configuration of the core substrate 4 will be exemplarily described, in which the heat transfer amount from the core section 5 to the package 2 can be decreased. FIG. 9 are plan views each illustrating an example of the core substrate 4 according to embodiment 3.

In the core substrate 4 according to embodiment 3, an opening 402 is provided in a region directly under the heater IC 52 that is a part of the core section 5 so as to almost superimpose on the region R1. Thanks to the opening 402, the contact area between the heater IC 52 and the core substrate 4 is reduced, which leads to decrease of the heat transfer amount from the heater IC 52 to the core substrate 4. As a result, it is possible to reduce the heat dissipation from the core section 5 to the package 2 caused by the heat transfer via the core substrate 4.

Note that the opening 402 does not completely include the region R1 inside the opening. The opening 402 has a shape that does not include at least four corners of the region R1. In this way, the heater IC 52 can be bonded and fixed to the core substrate 4 at the four corners thereof.

The opening 402 shown in FIG. 9(a) is formed so as to have the vertical size and the horizontal size both larger than the vertical size and the horizontal size of the region R1. Thus, the region R1 has a shape in which only the four corners thereof are not included in the opening 402. In this case, it is possible to minimize the contact area between the heater IC 52 and the core substrate 4, and thus to maximally obtain the heat transfer reduction effect (thermal insulation) by the opening 402.

On the other hand, the opening 402 shown in FIG. 9(b) is formed so as to have the vertical size and the horizontal size both smaller than the vertical size and the horizontal size of the region R1. Thus, the region R1 has a shape in which not only the four corners thereof but also whole the vicinity of the outer edge thereof are not included in the opening 402. In this case, it is possible that the opening 402 does not exist directly under the pads of the core section 5 for wire bonding when the core section 5 is bonded to the package 2 by wire bonding. As a result, the posture of the core section 5 can be stabilized when performing wire bonding and thus ultrasound can efficiently contribute to wire bonding, which leads to good wire bonding.

Embodiment 4

In embodiments 1 to 3 as described above, the package 2 is a single package. However, the present invention is not limited thereto. It is possible to use, for example, an H-shaped package as shown in FIG. 10, or a stacked configuration of two packages.

Figure 10:
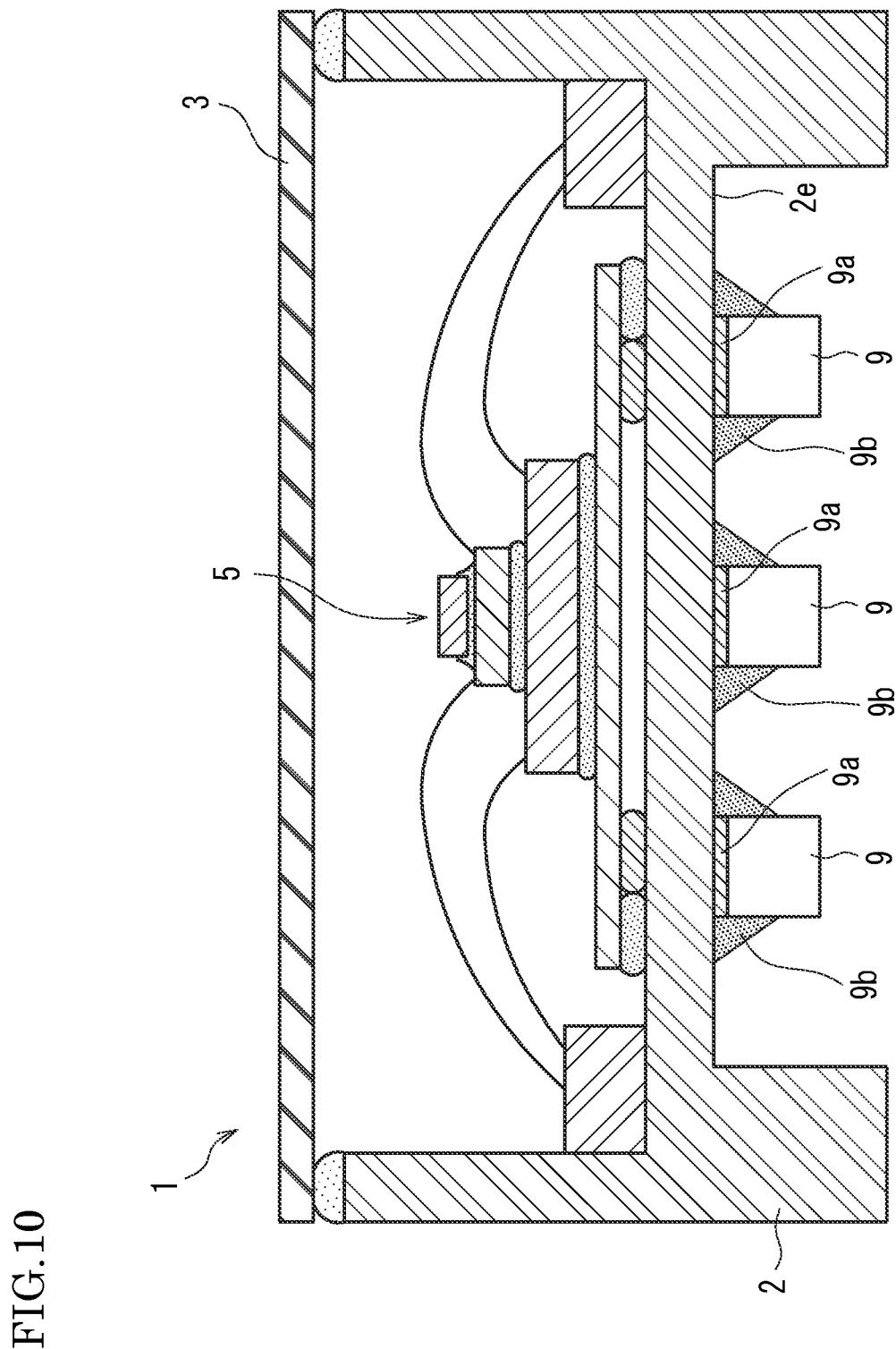
FIG. 10 is a cross-sectional view illustrating a variation of the OCXO.

As shown in FIG. 10, the OCXO 1 with the H-shaped package has the package 2 that includes, apart from the recess part 2a whose upper part is opened, a recess part 2e whose lower part is opened. In the recess part 2e that is formed in a second main surface that is opposite to a first main surface on which the core section 5 is mounted (i.e. the first main surface in which the recess part 2a is formed), it is possible to dispose a circuit component (a circuit component attached by a bonding material (for example, solder) for circuit component) such as a capacitor 9 as an electronic component for adjustment that is used in combination with the heater IC 52. Unlike the recess part 2a, the recess part 2e in which the capacitor 9 is disposed is not needed to be sealed by the lid 3.

Here, the capacitor 9 can also be disposed in the package where the core section is housed (i.e. in the recess part 2a). However, it is possible to reduce the heat capacity in the package by providing the circuit component outside the package as shown in FIG. 10. Thus, it is possible to control the temperature with low electric power and furthermore to improve the temperature followability of the core section 5. Also, it is possible to prevent subsequent generation of gas due to soldering or flux in the inner atmosphere of the hermetically sealed recess part 2a. Therefore, the core section 5 is not affected by the gas, which is desirable in order to realize further stabilization of electrical characteristics.

Figure 11:
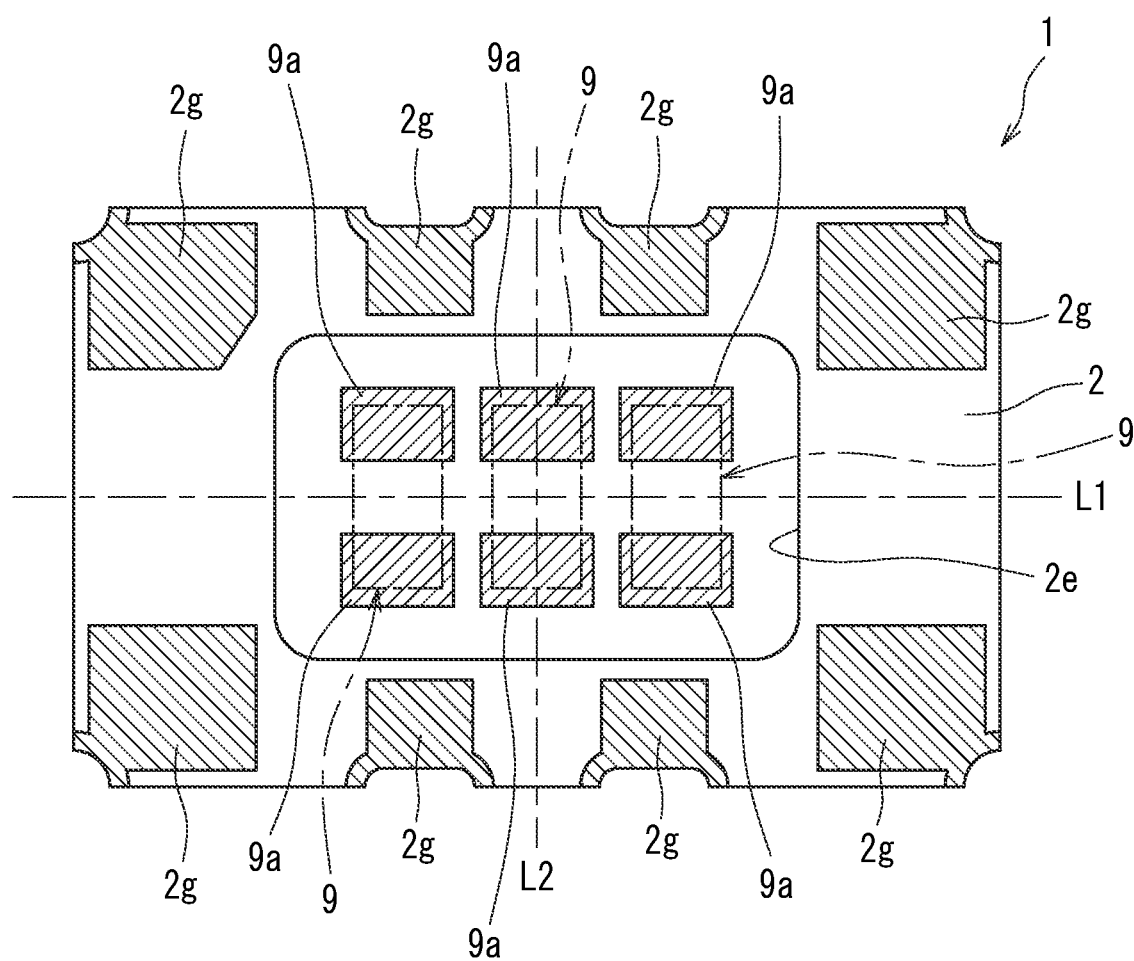
FIG. 11 is a bottom view illustrating the OCXO of FIG. 10.

In this embodiment, three capacitors 9 are mounted on the second main surface that is opposite to the first main surface of the package 2 (in this case, mounted on the bottom surface of the recess part 2e). As shown in FIG. 11, the capacitors 9 are bonded, by solder, to mounting pads 9a (mounting pads for circuit component) that are formed on the bottom surface of the recess part 2e of the package 2. In FIG. 11, the locations of the capacitors 9 are shown by the dashed-dotted line. A pair of mounting pads 9a and 9a is arranged so as to face each other in the short-side direction of the package 2.

Both end parts of each of the three capacitors 9 in the short-side direction of the package 2 are bonded to the mounting pads 9a and 9a.

As shown in FIG. 11, three pairs of mounting pads 9a and 9a are arranged at predetermined intervals in the long-side direction of the package 2. The mounting pads 9a are located like islands on the bottom surface of the package 2. Also, the package 2 and the three capacitors 9 each have a rectangular shape in plan view, and the three capacitors 9 are arranged so as to be symmetrical with respect to a center line L1 in the short-side direction of the package 2 and a center line L2 in the long-side direction of the package 2. In this case, it is sufficient that the locations of the three capacitors 9 are linearly symmetrical with respect to the center line L1 and the center line L2. Also, on the rear surface of the package 2, a plurality of (eight, in FIG. 11) external connection terminals 2g is formed so as to electrically connect the OCXO 1 to an external circuit board (not shown) provided outside via solder or the like.

In this embodiment, since the three capacitors 9 are arranged so as to be symmetrical with respect to the center line L1 in the short-side direction of the package 2 and the center line L2 in the long-side direction of the package 2, it is possible to make uniform the heat distribution in the whole package 2. In other words, since heat transfer in the whole package 2 is not likely to be uneven, it is possible to stabilize the temperature control or the properties of the OCXO 1. Also, since the capacitors 9 are arranged in a state in which their orientations are aligned and their intervals are constant, it is possible to position and mount the capacitors 9 on the mounting region of the second main surface of the package 2 without wasted place, which improves mountability.

The number of the capacitors 9 mounted on the second surface of the package 2 is not particularly limited. The number of the capacitors 9 may be other than three. Also, a circuit component other than the capacitor 9 may be mounted on the second surface of the package 2. Furthermore, the size (volume and surface area) of each circuit component is not necessarily required to be the same.

In the example shown in FIG. 11, the three capacitors 9 are arranged so as to be linearly symmetrical with respect to both the center line L1 and the center line L2. However, the three capacitors 9 may be linearly symmetrical with respect to at least one of the center lines L1 and L2. For example, the three capacitors 9 may be linearly symmetrical with respect to only the center line L1 in the short-side direction of the package 2. Alternatively, the three capacitors 9 may be linearly symmetrical with respect to only the center line L2 in the long-side direction of the package 2. In this way, it is possible to maintain symmetry in the heat transfer in a specific side direction of the package 2, which prevents unevenness of the heat transfer. Thus, it is possible to stabilize the temperature control or the properties of the OCXO 1.

Also, when the capacitors 9 are provided outside the package, forming the recess part 2e in the package 2 as shown in FIG. 10 is not indispensable. The second main surface opposite to the first main surface on which the recess part 2a is formed may be a flat surface, and the capacitors 9 may be provided on this flat surface.

Also, in the OCXO 1 having a stacked configuration of two packages, the two packages each having a recess part on only one side may be laminated in the up-down direction and electrically and mechanically connected to each other so that the upper package is hermetically sealed by the lid (not shown). In this case, the core section 5 is housed in the recess part of the upper package as shown in FIG. 1 while only the capacitor is housed in the lower package. Furthermore, as an example of another OCXO 1, it is possible to provide the configuration in which the capacitor 9 is provided on the lid 3 of FIG. 1.

The above-described core section 5 has a three-layer structure in which the oscillation IC 51, the crystal resonator 50 and the heater IC 52 are laminated in this order from the uppermost layer side. However, the present invention is not limited thereto. The oscillation IC 51 and the crystal resonator 50 may be horizontally placed (disposed side-by-side) on the heater IC 52. With this configuration, the crystal resonator 50 is hardly affected by the heat from the oscillation IC 51 and thus the respective temperatures of the crystal resonator 50 and the heater IC 52 are easily homogenized. Thus, it is possible to perform further accurate temperature control of the crystal resonator 50 as the temperature control target using a temperature sensor provided in the heater IC 52.

This application claims priority based on Patent Application No. 2021-031583 filed in Japan on Mar. 1, 2021. The entire contents thereof are hereby incorporated in this application by reference.

DESCRIPTION OF THE REFERENCE NUMERALS

1 OCXO (oven-controlled crystal oscillator)
2 Package
2d Space
2f Spacer member
4 Core substrate (flexible substrate)
5 Core section
7 Non-conductive adhesive (bonding material)
50 Crystal resonator (piezoelectric resonator)
51 Oscillation IC
52 Heater IC

The invention claimed is:

1. An oven-controlled crystal oscillator comprising: a core section; and a thermal insulation package in which the core section is hermetically encapsulated, wherein
   the core section includes at least: an oscillation integrated circuit (IC); a piezoelectric resonator; and a heater integrated circuit (IC),
   the core section is mounted on a flexible substrate that is mechanically connected to the thermal insulation package by a bonding material,
   the core section and the thermal insulation package are electrically connected to each other by wire bonding, and
   a space is provided between the flexible substrate and a bottom surface of the thermal insulation package.

2. The oven-controlled crystal oscillator according to claim 1, wherein
   a bonding region of the flexible substrate to bond the flexible substrate to the thermal insulation package is not superimposed, in plan view, on a mounting region of the flexible substrate to mount the core section thereon.

3. The oven-controlled crystal oscillator according to claim 2, wherein
   a spacer member is provided such that the spacer member is closer to the core section than the bonding region is, and
   the spacer member is interposed between the flexible substrate and the bottom surface of the thermal insulation package.

4. The oven-controlled crystal oscillator according to claim 1, wherein
   the flexible substrate is made of a resin material having heat resistance.

5. The oven-controlled crystal oscillator according to claim 1, wherein
   the core section is vacuum-sealed in the thermal insulation package.

6. The oven-controlled crystal oscillator according to claim 1, wherein
   the flexible substrate includes a slit that is formed between: a mounting region thereof, on a front surface of which the core section is mounted; and a bonding region thereof, which is to be bonded to the thermal insulation package.

7. The oven-controlled crystal oscillator according to claim 1, wherein
   an opening is provided in the flexible substrate, in a region directly under the core section.

8. The oven-controlled crystal oscillator according to claim 1, wherein
   the piezoelectric resonator is not directly connected to the thermal insulation package by wire, and
   only the oscillation integrated circuit (IC) is directly connected to the piezoelectric resonator by wire.

* * * * *